US007211754B2

(12) United States Patent
Wang et al.

(10) Patent No.: US 7,211,754 B2
(45) Date of Patent: May 1, 2007

(54) FLUID-BASED SWITCH, AND METHOD OF MAKING SAME

(75) Inventors: Youfa Wang, Singapore (SG); Winna Chia, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 88 days.

(21) Appl. No.: 11/195,047

(22) Filed: Aug. 1, 2005

(65) Prior Publication Data

US 2007/0023266 A1 Feb. 1, 2007

(51) Int. Cl.
*H10H 29/00* (2006.01)

(52) U.S. Cl. ........................ 200/182; 200/600; 335/47; 361/699; 333/246

(58) Field of Classification Search ................ 200/182, 200/600, 226–229; 335/47, 50–58; 361/699–704; 333/246–247
See application file for complete search history.

(56) References Cited

U.S. PATENT DOCUMENTS

| | | | | |
|---|---|---|---|---|
| 6,323,447 | B1 * | 11/2001 | Kondoh et al. | 200/182 |
| 6,717,495 | B2 * | 4/2004 | Kondoh et al. | 335/47 |
| 6,728,113 | B1 * | 4/2004 | Knight et al. | 361/760 |
| 6,743,991 | B1 | 6/2004 | Wong et al. | |
| 6,806,431 | B2 * | 10/2004 | Kondoh et al. | 200/182 |
| 6,822,176 | B1 | 11/2004 | Fazzio | |

* cited by examiner

*Primary Examiner*—Richard K. Lee

(57) ABSTRACT

In one embodiment, a switch includes first and second mated substrates defining therebetween a number of cavities. A plurality of electrically conductive elements extends to near at least a first of the cavities. A switching fluid, held within at least the first of the cavities, serves to electrically, but not physically, couple and decouple at least a pair of the electrically conductive elements, in response to forces that are applied to the switching fluid. A passivation layer covers at least a first of the electrically conductive elements and i) separates the first of the electrically conductive elements from at least the first of the cavities, and ii) is a dielectric for a capacitor formed between the first of the electrically conductive elements and the switching fluid. Other switches, and methods for making same, are also disclosed.

26 Claims, 5 Drawing Sheets

FLUID-BASED SWITCH, AND METHOD OF MAKING SAME

BACKGROUND

A fluid-based switch such as a liquid metal micro switch (LIMMS) comprises a switching fluid (e.g., mercury) that serves to electrically couple and decouple at least a pair of electrically conductive elements in response to forces that are applied to the switching fluid. Typically, the forces are applied to the switching fluid by means of an actuating fluid that is heated or pumped.

SUMMARY OF THE INVENTION

In one embodiment, a switch comprises first and second mated substrates that define therebetween a number of cavities. A plurality of electrically conductive elements extends to near at least a first of the cavities. A switching fluid is held within at least the first of the cavities and serves to electrically, but not physically, couple and decouple at least a pair of the electrically conductive elements, in response to forces that are applied to the switching fluid. A passivation layer covers at least a first of the electrically conductive elements and i) separates the first of the electrically conductive elements from at least the first of the cavities, and ii) is a dielectric for a capacitor formed between the first of the electrically conductive elements and the switching fluid.

In another embodiment, a method for forming a switch comprises depositing a plurality of electrically conductive elements on a first substrate. A passivation layer is then deposited on at least a first of the electrically conductive elements, and the first substrate is mated to a second substrate to seal a switching fluid in one or more cavities formed between the first and second substrates. The one or more cavities are sized to allow movement of the switching fluid between first and second states. The passivation layer i) separates the first of the electrically conductive elements from the one or more cavities, and ii) serves as a dielectric for a capacitor formed between the first of the electrically conductive elements and the switching fluid.

Other embodiments are also disclosed.

BRIEF DESCRIPTION OF THE DRAWINGS

Illustrative embodiments of the invention are illustrated in the drawings, in which.

DETAILED DESCRIPTION

Figure 1:
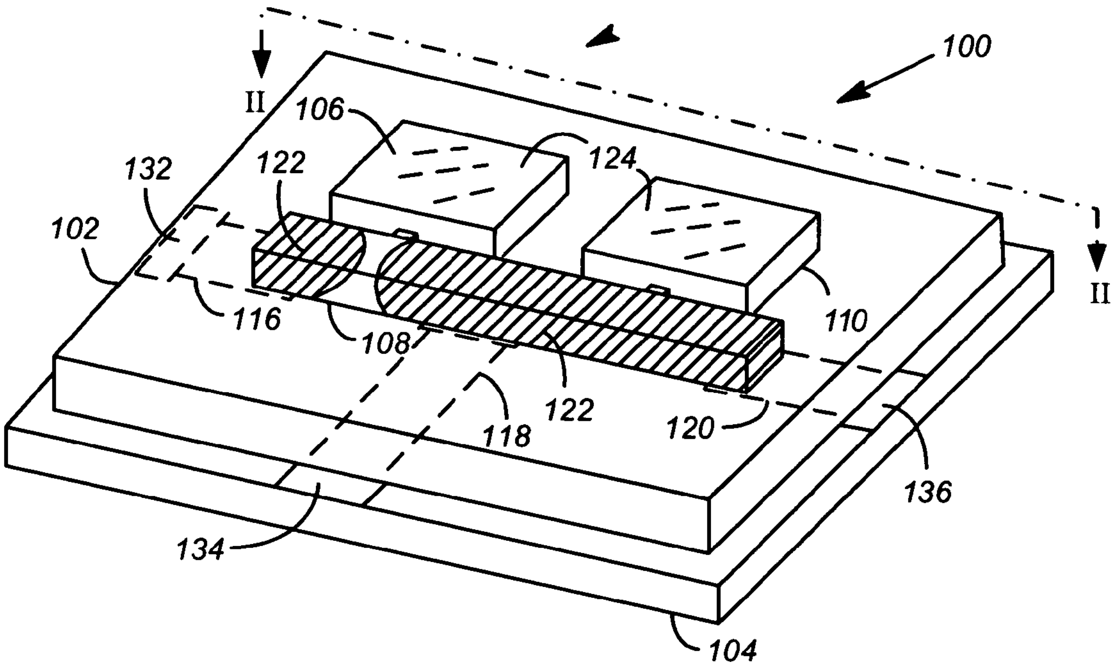
FIGS. 1–3 illustrate a first exemplary embodiment of a fluid-based switch.
Figure 2:
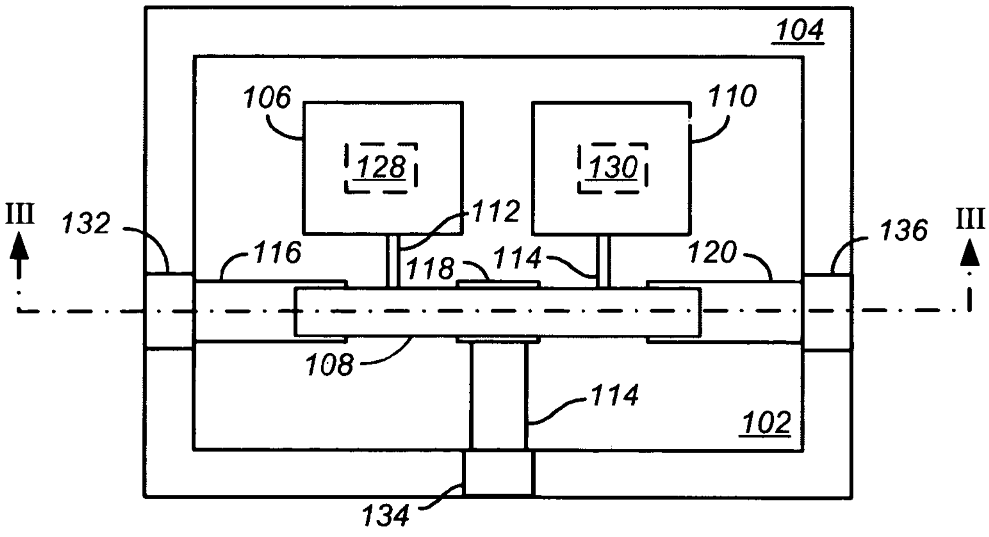
Figure 3:
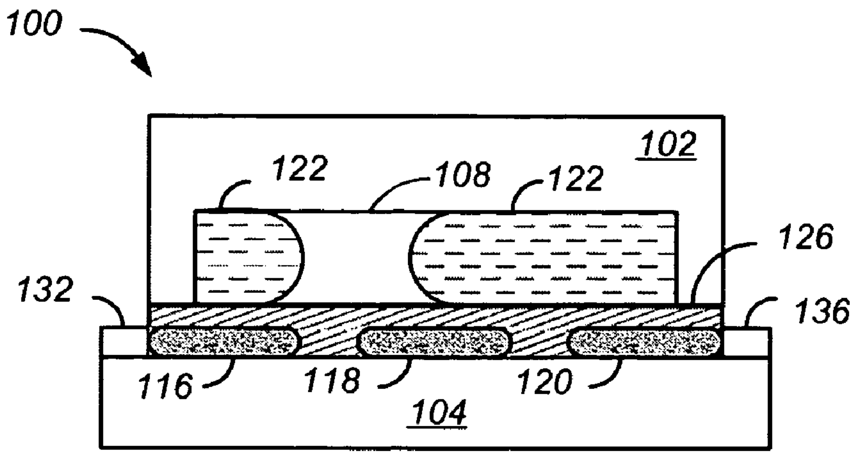

FIGS. 1–3 illustrate a first exemplary embodiment of a fluid-based switch 100. The switch 100 comprises first and second mated substrates 102, 104 that define therebetween a number of cavities 106, 108, 110, 112, 114. Although five cavities 106–114 are shown in FIG. 1, it is envisioned that more or fewer cavities may be formed within the switch 100. By way of example, the cavities are shown to comprise a switching fluid cavity 108, a pair of actuating fluid cavities 106, 110, and a pair of cavities 112, 114 that connect corresponding ones of the actuating fluid cavities 106, 110 to the switching fluid cavity 108. A plan view of these cavities 106–114 is shown in FIG. 2.

Extending to near a first one or more of the cavities (and as best seen in FIG. 3) is a plurality of electrically conductive elements 116, 118, 120. Although the switch 100 is shown with three electrically conductive elements 116–120, alternate switch embodiments may have different numbers of (two or more) electrically conductive elements.

A switching fluid 122 that is held within one or more of the cavities serves to couple and decouple at least a pair of the electrically conductive elements 116–120 in response to forces that are applied to the switching fluid 122. By way of example, the switching fluid 122 may comprise a conductive liquid metal, such as mercury, gallium, sodium potassium or an alloy thereof. An actuating fluid 124 (e.g., an inert gas or liquid) held within one or more of the cavities may be used to apply the forces to the switching fluid 122.

A cross-section of the switch 100, illustrating the switching fluid 122 in relation to the electrically conductive elements 116–120, is shown in FIG. 3.

The forces applied to the switching fluid 122 may result from pressure changes in the actuating fluid 124. That is, the pressure changes in the actuating fluid 124 may impart pressure changes to the switching fluid 122, thereby causing the switching fluid 122 to change form, move, part, etc. In FIG. 1, the pressure of the actuating fluid 124 held in cavity 106 applies a force to part the switching fluid 122 as illustrated. In this state, the rightmost ones of the switch's electrically conductive elements 118, 120 are coupled to one another. If the pressure of the actuating fluid 124 held in cavity 106 is relieved, and the pressure of the actuating fluid 124 held in cavity 110 is increased, the switching fluid 122 can be forced to part and merge so that electrically conductive elements 118 and 120 are decoupled and electrically conductive elements 116 and 118 are coupled.

By way of example, pressure changes in the actuating fluid 124 may be achieved by means of heating the actuating fluid 124 (e.g., by heaters 128, 130), or by means of piezoelectric pumping. The former is described in U.S. Pat. No. 6,323,447 of Kondoh et al. entitled "Electrical Contact Breaker Switch, Integrated Electrical Contact Breaker Switch, and Electrical Contact Switching Method", which is hereby incorporated by reference for all that it discloses. The latter is described in U.S. Pat. No. 6,750,594 of Wong entitled "A Piezoelectrically Actuated Liquid Metal Switch", which is also incorporated by reference for all that it discloses. Although the above referenced patents disclose the movement of a switching fluid by means of dual push/pull actuating fluid cavities, a single push/pull actuating fluid cavity might suffice if significant enough push/pull pressure changes could be imparted to a switching fluid from such a cavity.

Additional details concerning the construction and operation of a switch such as that which is illustrated in FIGS. 1–3 may be found in the afore-mentioned patents of Kondoh et al. and Wong.

A feature of the switch 100 which has yet to be discussed is the passivation layer 126. The passivation layer 126 covers at least a first of the electrically conductive elements 116–120, and preferably covers all of the electrically conductive elements 116–120. In this manner, the passivation layer 126 separates one or more of the electrically conductive elements 116–120 from the cavity 108 and serves as a dielectric for one or more capacitors formed between the electrically conductive elements 116–120 and the switching fluid 122.

Figure 5:
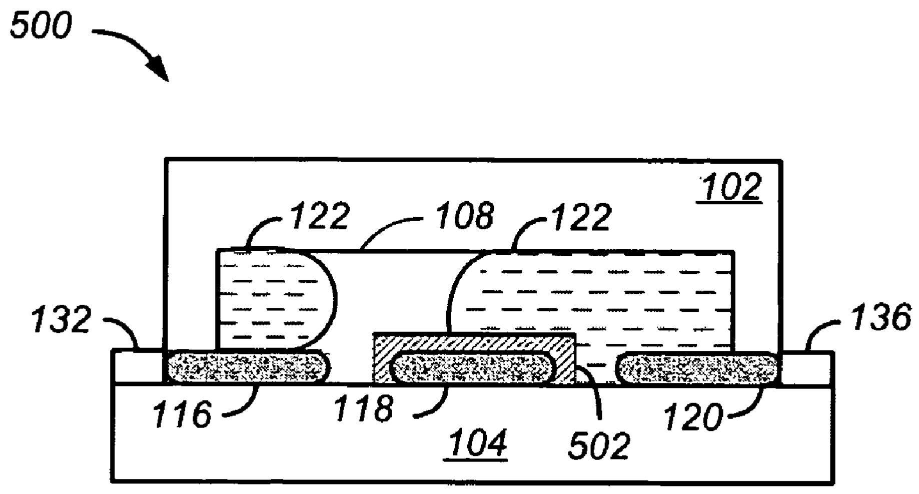
FIG. 5 illustrates an alternative positioning of a passivation layer shown in FIG. 1.
Figure 6:
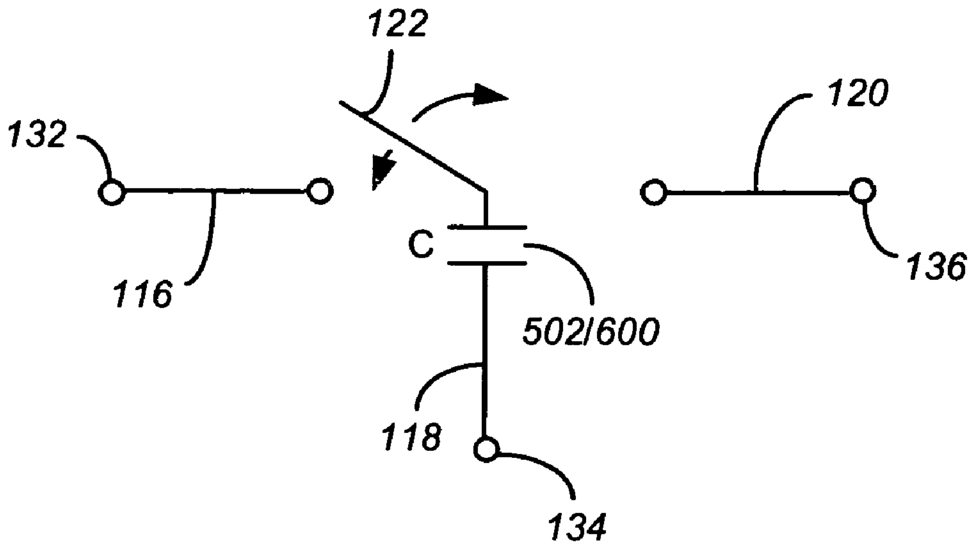
FIG. 6 illustrates a schematic representation of the switch shown in FIG. 5.

In FIG. 5, the passivation layer 502 covers the central conductive element 118 of the switch 500. A schematic representation of this switch embodiment is shown in FIG. 6. One will note that, regardless of the state in which the switch 100 is placed, a capacitor 600 (formed as a result of the passivation layer 502) appears in the electrical path through the switch 100. By choosing the material used to form the passivation layer 502, and by controlling its thickness, the value of the capacitor 600 may be adjusted. Given that many radio frequency (RF) switching circuits have no need to pass direct current (DC), the capacitor 600 may be used as a DC block capacitor.

Figure 4:
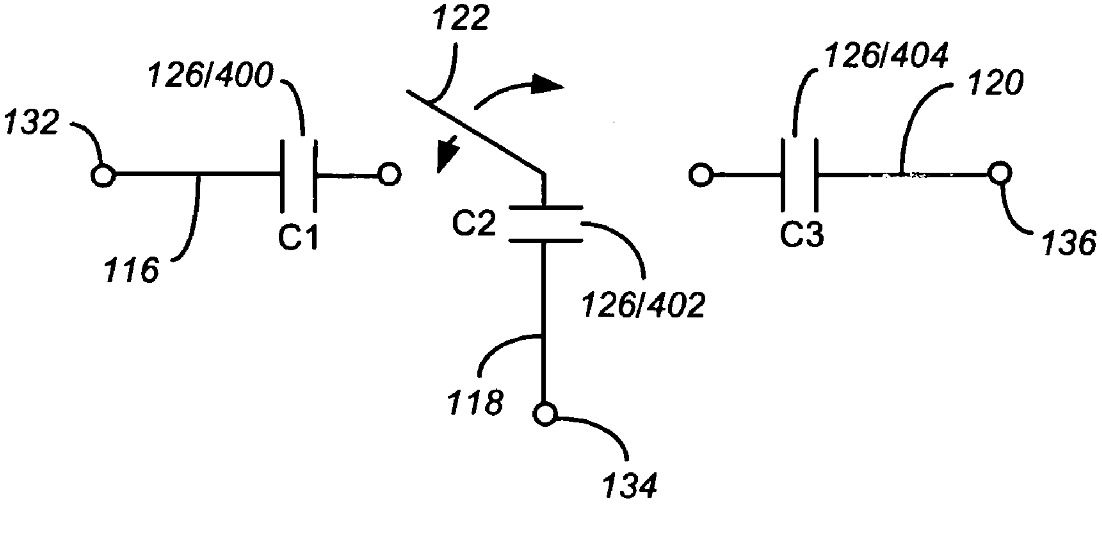
FIG. 4 illustrates a schematic representation of the switch shown in FIG. 4.

FIGS. 1–3 illustrate a switch embodiment 100 wherein a passivation layer 126 covers all of the electrically conductive elements 116–120. In addition, the passivation layer 126 may be deposited between the electrically conductive elements 116–120 and may form a uniform continuous surface over the electrically conductive elements 116–120. A schematic representation of this switch embodiment is shown in FIG. 4. In this circuit, two capacitors (400/402 or 402/404) appear in an electrical path through the switch 100 at any given moment. However, by choosing the material used to form the passivation layer 126, and by controlling its thickness, the capacitors 400–404 may provide the same function as the single capacitor 600 (FIG. 6).

One will note that the passivation layers 126, 502 shown in FIGS. 3 & 5 electrically, but not physically, couple the switching fluid 122 to the electrically conductive elements 116–120 that are covered by the passivation layers 126, 502. When the passivation layer 126 is used to cover all of the electrically conductive elements 116–120, the formation of alloys (e.g., amalgams) between the switching fluid 122 and electrically conductive elements 116–120 is prevented. Covering the electrically conductive elements 116–120 with the passivation layer 126 also tends to limit both oxidation and contamination of the electrically conductive elements 116–120 as a result of impurities in the switching and actuating fluids 122, 124, as well as any stray gases (e.g., oxygen) that are trapped in the cavity 108. Further, covering the electrically conductive elements 116–120 tends to limit contamination of the switching fluid 122 as a result of impurities in the electrically conductive elements 116–120 and the substrate 104.

In prior fluid-based switches, the surface tension of the switching fluid 122, as it wetted to the electrically conductive elements 116–120, could sometimes lead to stiction that was difficult for the forces applied by the actuating fluid 124 to overcome. When this occurred, a switch did not switch properly. By covering one or more of the electrically conductive elements 116–120, the passivation layers 126, 502 can mitigate the effects of stiction between the electrically conductive elements 116–120 and the switching fluid 122. However, some amount of stiction is typically needed to keep a switch from inadvertently switching (e.g., due to bumps, drops and vibrations).

Figure 7:
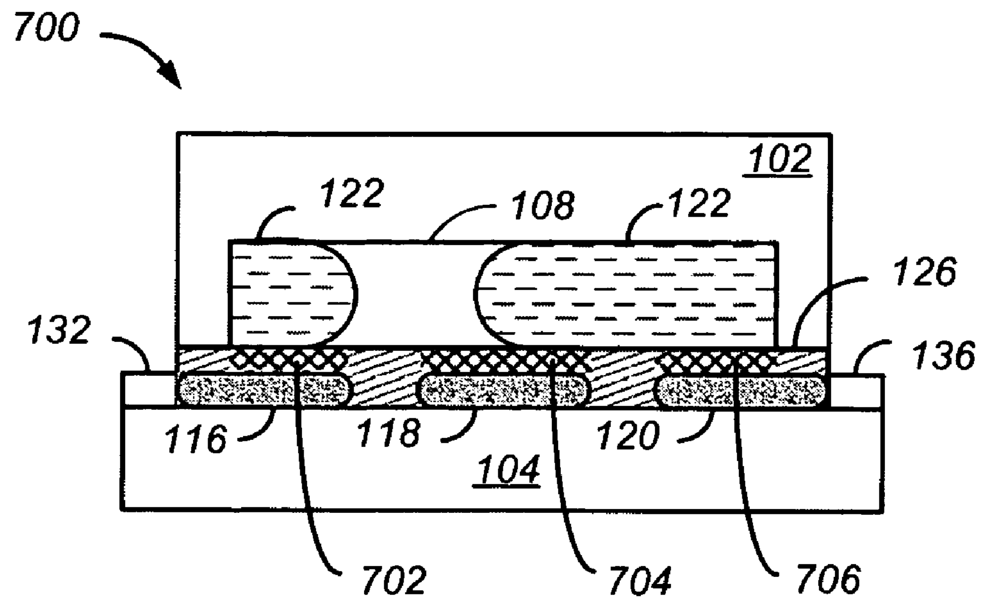
FIG. 7 illustrates a switch wherein wettable surfaces are formed by roughening portions of the switch's passivation layer.
Figure 8:
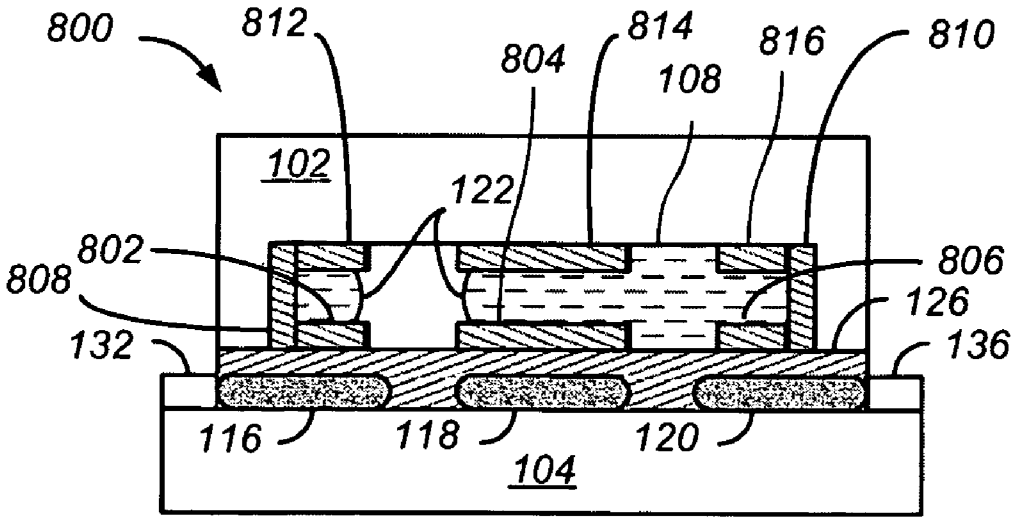
FIG. 8 illustrates a switch wherein wettable surfaces are formed by layers of metal that are deposited on walls of the switch's switching fluid cavity.

If a passivation layer 126, 502 eliminates too much stiction, stiction can be increased by providing a switch with a plurality of surfaces to which its switching fluid wets. FIG. 7 illustrates a switch 700 wherein wettable surfaces 702, 704, 706 are formed by roughening portions of the passivation layer 126. FIG. 8 illustrates a switch 800 wherein wettable surfaces 802, 804, 806, 808, 810, 812, 814, 816 are formed by layers of metal that are deposited on walls of the cavity 108. The layers of metal may be deposited in various locations, including "on" the passivation layer 126, or on other walls of the cavity 108, including its top, bottom, sides and ends. The layers of metal may comprise any metal to which a particular switching fluid 122 wets. However, one of the layers is preferably a metal that has a low (or no) probability of forming alloys with the switching fluid 122. In this manner, the wettable surfaces 802–816 will not fully resolve into the switching fluid 122. By way of example, the wettable surfaces 802–816 may comprise at least one of: iridium, rhodium, platinum and chromium.

The wettable surfaces 702–706 or 802–816 are preferably positioned over, and aligned with, the electrically conductive elements 116–120. In this manner, the values of the capacitances formed by the passivation layer 126 and 502 can be more precisely controlled, and parasitic capacitance and other undesirable electrical phenomenon can be avoided.

By way of example, the passivation layers 126, 502 may comprise silicon dioxide, silicon nitride, silicon carbon, or polysilicon; and, in some cases, a passivation layer may comprise multiple layers of different materials. In one embodiment, the passivation layer is deposited using a chemical vapor deposition process.

In the past, it has been difficult to construct a fluid-based switch with conductive runners that extend from within to outside the switch's switching fluid cavity. This is because switching fluid 122 would normally wet to the conductive runners 116–120 and be drawn between the substrates 102, 104 during switch manufacture. However, in the switch 100, the switching fluid 122 does not physically contact the conductive runners 116–120. Furthermore, the passivation layer 126 may be selected so that it is not wettable by the switching fluid 122. In this manner, the conductive runners 116–120 may extend from near the first of the cavities 108 to one or more exterior surfaces of the switch 100, without the switching fluid 122 being drawn between the substrates 102, 104.

A plurality of bonding pads 132, 134, 136 may be formed at ends of the conductive runners 116–120. In some embodiments, the bonding pads 132–136 and/or conductive runners 116–120 as a whole, may be formed from a layer of titanium, on which a layer of platinum is deposited, on which a layer of gold is deposited. In alternate embodiments, the bonding pads 132–136 and/or conductive runners 116–120 may be formed from one or more other materials (or combinations of materials).

Figure 9:
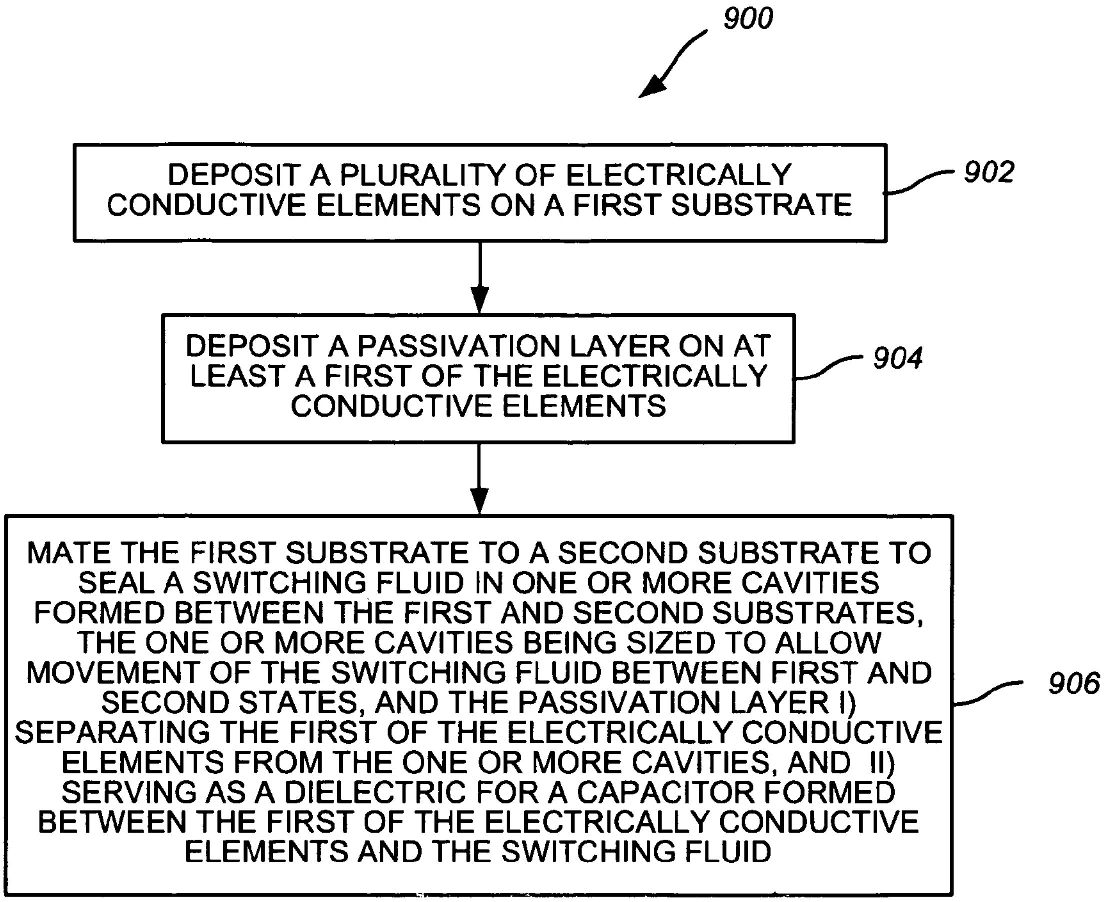
FIG. 9 illustrates an exemplary method for forming the switch shown in FIG. 1.

FIG. 9 illustrates an exemplary method for forming the switch 100. The method comprises depositing 902 a plurality of electrically conductive elements 116–120 on a first substrate 104. A passivation layer 126 is then deposited 904 on at least a first of the electrically conductive elements 118. Thereafter, the first and second substrates 102, 104 are mated 906 to seal a switching fluid 122 in a cavity 108 formed between the first and second substrates 102, 104. The cavity is sized to allow movement of the switching fluid 122 between first and second states. The passivation layer 126 1)

separates the first of the electrically conductive elements 118 from the cavity 108, and 2) serves as a dielectric for a capacitor formed between the first of the electrically conductive elements 118 and the switching fluid 122.

What is claimed is:

1. A switch, comprising:

first and second mated substrates defining therebetween a number of cavities;

a plurality of electrically conductive elements, extending to near at least a first of the cavities;

a switching fluid, held within a first of the cavities, that serves to electrically, but not physically, couple and decouple at least a pair of the electrically conductive elements, in response to forces that are applied to the switching fluid; and a passivation layer covering at least a first of the electrically conductive elements, wherein the passivation layer i) separates the first of the electrically conductive elements from at least the first of the cavities, and ii) is a dielectric for a capacitor formed between the first of the electrically conductive elements and the switching fluid.

2. The switch of claim 1, wherein the passivation layer comprises silicon dioxide.

3. The switch of claim 1, wherein the passivation layer comprises silicon nitride.

4. The switch of claim 1, wherein the passivation layer comprises silicon carbon.

5. The switch of claim 1, wherein the passivation layer comprises polysilicon.

6. The switch of claim 1, wherein the passivation layer covers a plurality of the electrically conductive elements and i) separates the plurality of electrically conductive elements from at least the first of the cavities, and ii) is a dielectric for capacitors formed between the electrically conductive elements and the switching fluid.

7. The switch of claim 6, wherein the passivation layer is deposited between the electrically conductive elements.

8. The switch of claim 6, wherein the passivation layer forms a uniform continuous surface over the electrically conductive elements.

9. The switch of claim 1, wherein the passivation layer comprises multiple layers of different materials.

10. The switch of claim 1, further comprising a plurality of surfaces to which the switching fluid wets within at least the first of the cavities.

11. The switch of claim 10, wherein the surfaces to which the switching fluid wets comprise roughened portions of the passivation layer.

12. The switch of claim 10, wherein the surfaces to which the switching fluid wets comprise layers of metal deposited on the passivation layer.

13. The switch of claim 10, wherein the surfaces to which the switching fluid wets comprise layers of metal deposited on walls of at least the first of the cavities.

14. The switch of claim 10, wherein the surfaces to which the switching fluid wets comprise at least one of: iridium, rhodium, platinum and chromium.

15. The switch of claim 1, wherein the electrically conductive elements comprise conductive runners extending from near the first of the cavities to one or more exterior surfaces of the switch.

16. The switch of claim 15, further comprising a plurality of bonding pads, formed at ends of the conductive runners that present on the exterior surface(s) of the switch.

17. The switch of claim 15, wherein the conductive runners comprise layers of titanium, platinum and gold.

18. The switch of claim 1, wherein the switching fluid comprises liquid metal.

19. The switch of claim 1, further comprising an actuating fluid, held within one or more of the cavities, that serves to apply the forces to the switching fluid.

20. A method for forming a switch, comprising:

depositing a plurality of electrically conductive elements on a first substrate;

depositing a passivation layer on at least a first of the electrically conductive elements; and mating the first substrate to a second substrate to seal a switching fluid in one or more cavities formed between the first and second substrates, the one or more cavities being sized to allow movement of the switching fluid between first and second states, and the passivation layer i) separating the first of the electrically conductive elements from the one or more cavities, and ii) serving as a dielectric for a capacitor formed between the first of the electrically conductive elements and the switching fluid.

21. The method of claim 20, further comprising, prior to mating the first substrate to the second substrate, forming on the passivaton layer a plurality of surfaces to which the switching fluid wets.

22. The method of claim 21, wherein the surfaces to which the switching fluid wets are formed by roughening portions of the passivation layer.

23. The method of claim 21, wherein the surfaces to which the switching fluid wets are formed by depositing layers of metal on the passivation layer.

24. The method of claim 20, wherein the passivation layer is deposited over a plurality of the electrically conductive elements and i) separates the plurality of electrically conductive elements from the one or more cavities, and ii) is a dielectric for capacitors formed between the electrically conductive elements and the switching fluid.

25. The method of claim 20, wherein the passivation layer is deposited using a chemical vapor deposition process.

26. A switch, comprising:

first and second mated substrates defining therebetween a number of cavities;

a plurality of electrically conductive elements, extending to near at least a first of the cavities;

a switching fluid, held within at least the first of the cavities, that serves to electrically, but not physically, couple and decouple at least a pair of the electrically conductive elements, in response to forces that are applied to the switching fluid; and means to cover at least a first of the electrically conductive elements, to i) separate the first of the electrically conductive elements from at least the first of the cavities, and ii) form a dielectric for a capacitor formed between the first of the electrically conductive elements and the switching fluid.

* * * * *

UNITED STATES PATENT AND TRADEMARK OFFICE

CERTIFICATE OF CORRECTION

PATENT NO. : 7,211,754 B2
APPLICATION NO. : 11/195047
DATED : May 1, 2007
INVENTOR(S) : Youfa Wang It is certified that error appears in the above-identified patent and that said Letters Patent is hereby corrected as shown below:

Col. 6 Line 2-3 In Claim 16, after “runners” delete “that present on the exterior surface(s) of the switch.” and insert -- . --, therefor.

Col. 6, Line 28 (Approx.) In Claim 21, delete “passivaton” and insert -- passivation --, therefor.

Signed and Sealed this

Sixteenth Day of December, 2008

JON W. DUDAS
*Director of the United States Patent and Trademark Office*